(12) United States Patent
Tseng et al.

(10) Patent No.: US 12,326,167 B2
(45) Date of Patent: Jun. 10, 2025

(54) CHASSIS QUICK RELEASE DEVICE

(71) Applicant: HANWIT PRECISION INDUSTRIES LTD., New Taipei (TW)

(72) Inventors: Ying-Chih Tseng, New Taipei (TW); Ming-De Wu, New Taipei (TW); Ching-Kai Chang, New Taipei (TW)

(73) Assignee: HANWIT PRECISION INDUSTRIES LTD., New Taipei (TW)

( * ) Notice: Subject to any disclaimer, the term of this patent is extended or adjusted under 35 U.S.C. 154(b) by 0 days.

(21) Appl. No.: 18/402,275

(22) Filed: Jan. 2, 2024

(65) Prior Publication Data

US 2024/0141939 A1 May 2, 2024

Related U.S. Application Data

(63) Continuation-in-part of application No. 18/311,840, filed on May 3, 2023, now Pat. No. 12,058,832.

(30) Foreign Application Priority Data

Sep. 2, 2022 (TW) .................................. 111133434

(51) Int. Cl.
*F16B 7/22* (2006.01)
*H05K 7/14* (2006.01)

(52) U.S. Cl.
CPC ............. *F16B 7/22* (2013.01); *H05K 7/1489* (2013.01)

(58) Field of Classification Search
CPC ......... A47B 57/30; A47B 57/32; A47B 57/34; A47B 57/40; A47B 57/402; A47B 57/404; A47B 57/406; A47B 57/408; A47B 57/42; A47B 57/425; A47B 57/44; A47B 57/46; A47B 57/48; A47B 57/482; A47B 57/485; A47B 57/487; A47B 57/50; A47B 57/52; A47B 57/54; A47B 57/545; A47B 57/56; A47B 57/562; A47B 57/565; A47B 57/567; A47B 88/407; A47B 88/938; A47B 2088/94; A47B 2088/939; H05K 7/1485; H05K 7/1488; H05K 7/1489;

(Continued)

(56) References Cited

U.S. PATENT DOCUMENTS 9,723,745 B2 * 8/2017 Qi ............................. G06F 1/18
9,795,052 B2 * 10/2017 Hsiao ....................... H05K 7/18

(Continued)

*Primary Examiner* — Joshua E Rodden
(74) *Attorney, Agent, or Firm* — Muncy, Geissler, Olds & Lowe, P.C.

(57) ABSTRACT

A chassis quick release device includes a housing including a base with a connected sliding channel and accommodating space therein and a cover assembled with the base, a locking block linearly movably set in the accommodating space, and an operating handle having a rod body positioned on the sliding channel and a grip assembled with the rod body. The rod body has a cylindrical joint that corresponds to the grip and has a shaft groove defined therein. The grip is provided with a sleeve corresponding to the cylindrical joint and defining therein an accommodating cavity. Moving the operating handle in the direction of the housing causes the locking block to slide out from the accommodating space to form a locked state. Pulling the operating handle away from the housing causes the locking block to move linearly in a second direction to form an unlocked state.

9 Claims, 14 Drawing Sheets

(58) Field of Classification Search
CPC .. H05K 7/1491; H05K 7/1492; H05K 7/1494; H05K 7/1495; H05K 7/18; H05K 7/183; H05K 7/186
USPC .......................................................... 211/187
See application file for complete search history.

(56) References Cited

U.S. PATENT DOCUMENTS

| | | | |
|---|---|---|---|
| 9,877,407 B1* | 1/2018 | Sim ..................... | H04Q 1/06 |
| 10,765,028 B1* | 9/2020 | Beall .................... | H05K 7/1489 |
| 11,659,680 B2* | 5/2023 | Lu ........................ | H05K 7/1489 |
| | | | 361/679.02 |
| 2013/0241377 A1* | 9/2013 | Zhang ................... | G06F 1/181 |
| | | | 403/188 |
| 2014/0001314 A1* | 1/2014 | Gong .................... | H05K 7/1491 |
| | | | 248/49 |
| 2016/0345453 A1* | 11/2016 | Zhang ................... | H05K 5/0234 |
| 2018/0228049 A1* | 8/2018 | Liao ..................... | A47B 88/477 |
| 2023/0345660 A1* | 10/2023 | Chen .................... | H05K 7/1489 |
| 2024/0081017 A1* | 3/2024 | Tseng ................... | H05K 7/1488 |
| 2024/0206100 A1* | 6/2024 | Huang .................. | H05K 7/1415 |

\* cited by examiner

CHASSIS QUICK RELEASE DEVICE

CROSS REFERENCE TO THE RELATED APPLICATIONS

This application is a Continuation-In-Part of application Ser. No. 18/311,840, filed on May 3, 2023, for which priority is claimed under 35 U.S.C. § 120, the entire contents of which are hereby incorporated by reference.

This application claims the priority benefit of Taiwan patent application number 111133434, filed on Sep. 2, 2022.

BACKGROUND OF THE INVENTION

1. Field of the Invention

The present invention provides a chassis quick release device, especially a quick release positioning structure arranged between the server chassis and the cabinet, so as to achieve the purpose of quick disassembly, assembly and easy operation.

2. Description of the Related Art

With the vigorous development of electronic technology, automatic control through electronic technology and computer systems can lead people to convenient, comfortable, fast, and other high-efficiency functions in life and work. In addition to general personal use, computers can also be managed and controlled through a central integrated system. For example: industrial computer rooms, central management and control system of buildings, central management and control system of automatic plant operation system, central processing and control system of audio, video, and video broadcasting, etc., are all connected to multiple computer hosts, servers, and operation conversion systems at the same time through centralized management. Chassis are assembled in a large server cabinet by vertical stacking, and the chassis can be pulled or pushed outward from the side of the cabinet for assembly of various computer operating systems or hardware maintenance.

Because the server needs to combine multiple operating host systems, when various computer operating systems need to perform related operations, such as testing and updating programs, the chassis on different layers and positions must be pulled out of the cabinet one by one to facilitate testing or related maintenance work. When many stacked chassis are assembled in the cabinet, there is a quick-release buckle structure to position the chassis in the cabinet. Please refer to FIGS. 13 and 14 for the buckle structure currently used. The buckle structure of the conventional cabinet is to use the movable handle A to lock the internal screw hole B11 of the cylinder B1 of the combined object B with the locking element A1, so that the movable handle A can use the cylinder B1 on the combined object B to rotate, swing. Through the buckle A2 on the movable handle A, the purpose of locking is achieved, but there are still many inconveniences and deficiencies in actual assembly and application, such as:

1. After the movable handle A is pushed to the position and then buckled and positioned through the buckle A2, the movable handle A is not positioned. As long as it is slightly affected by an external force, it is quite easy to loosen, causing the buckle A2 to unbuckle.
2. The movable handle A is set outside the cylinder B1 through the straight hole A31 of the pivot joint A3 of one side, and then locked in the inner screw hole B11 of the cylinder B1 by means of the locking element A1, then the movable handle A belongs to the method of being movably sleeved on the cylinder B1, and it is easy to cause the chassis to loosen and slip in the cabinet.

Therefore, how to solve the problem that the movable handle of the conventional chassis is not smooth when performing maintenance work, and affects the looseness and trouble of the chassis inside the cabinet containing the computer operating system, is the direction that relevant manufacturers engaged in this industry are eager to study and improve.

SUMMARY OF THE INVENTION

Therefore, in view of the above-mentioned problems and deficiencies, the inventor collected relevant information, and after various evaluations and considerations, the invention of this chassis quick release device was designed and born.

The main object of the present invention is to provide a chassis quick release device, comprising a housing, a locking block, and an operating handle. The housing comprises a base and a cover that can be combined with each other. The base comprises a sliding channel and an accommodating space connected to each other. The locking block is combined in the accommodating space and is movable linearly. The operating handle comprises a rod body positioned on the sliding channel. The rod body is assembled with a grip. The rod body comprises a cylindrical joint corresponding to the grip. The cylindrical joint defines therein a shaft groove. The grip is provided with a sleeve corresponding to the cylindrical joint. The sleeve defines therein an accommodating cavity. Through the structure of the chassis quick release device, the grip is capable of producing rotational steering on the rod body to facilitate pulling out of the preset chassis. When moving the operating handle in the direction of the housing, the locking block makes a linear movement in a first direction and slides out from the accommodating space to form a locked state. When pulling the operating handle away from the housing, the locking block makes a linear movement in a second direction to form an unlocked state. The aforementioned mechanism and action are used as a quick-release positioning structure between the server chassis and the cabinet to achieve quick disassembly, assembly, and easy operation.

It is another object of the present invention to provide a chassis quick release device, wherein the base further comprises a compression space in the sliding channel and the accommodating space. The compression space is further provided with a resistance wall for one end of at least a linear reset member to resist. Each linear reset member has an opposite end thereof held against a resisting plate radially extending from the rod body to provide a reset force for the operating handle to move toward the direction of the housing, and each linear reset member is a spring.

It is still another object of the present invention to provide a chassis quick release device, wherein the locking block is provided with a guide groove and a guide chamber communicated with each other, and the locking block further comprises a receiving groove, at least one elastic member accommodated in the receiving groove, a stop plate located adjacent to the guide groove to form a linear sliding dead center, and a chute rising obliquely on a top side of the stop plate. The base further comprises a resistance groove formed in the accommodating space corresponding to the sliding dead center of the stop plate.

It is still another object of the present invention to provide a chassis quick release device, wherein the locking block is provided with at least one positioning piece in an opening of the receiving groove for one end of each elastic member to be placed on one respective positioning piece. Each positioning piece has one side thereof disposed away from the at least one elastic member and held against an inner side of the cover. Each elastic member has one end thereof sleeved onto one respective positioning piece, and an opposite end thereof stopped against a bottom wall of the receiving groove.

It is another object of the present invention to provide a chassis quick release device, wherein the guide chamber of the locking block is a double triangular space with a larger interior and a smaller exterior; the guide chamber further forms a "U"-shaped slope at a bottom of a corresponding outer triangle thereof; the rod body forms a locking portion accommodated in said guide chamber, said locking portion corresponding to a "U"-shaped structure and having two side walls thereof forming a triangular structure, and the two side walls of the triangular structure each forming a resisting edge in contact with the slope; the locking portion is provided with a resisting bump located between the two resisting edges and disposed of in contact with an inner triangular bottom of the guide chamber, and one of the two side walls of the locking portion forms a locking area.

It is another object of the present invention to provide a chassis quick release device, wherein the base further comprises a rotation space located on a bottom side thereof adjacent to the accommodating space, and a shaft protruding in the rotation space. The shaft is composed of a rivet inserted between the base and the cover. The rotation space is provided with a latch. The latch comprises an internal shaft hole sleeved on the shaft. The latch is provided with a rotary reset member positioned on the shaft. The latch has one end thereof formed with a resisting edge that is capable of rotatably protruding from the housing, and an opposite end thereof formed with a locking edge opposite to the resisting edge. The rotary reset member refers to a torsion spring and is accommodated in a storage chamber in the latch to divide the shaft hole into two portions. The torsion spring has the center thereof provided for the shaft to penetrate, one end thereof stopped against an inner wall of the storage chamber, and an opposite end thereof stopped against an inner wall of the rotation space.

It is another object of the present invention to provide a chassis quick release device, wherein the rod body of the operating handle is positioned on the sliding channel, the guide groove and the guide chamber. The rod body resists the guide chamber to form a locking portion. The rod body comprises a guide extending upward obliquely between the locking portion and the resisting plate and passing through the chute of the locking block. The rod body is assembled with the grip far away from the locking portion and has two stop pieces expanding to both sides between the cylindrical joint and the resisting plate. The stop pieces form the bottom dead center which the operating handle moves towards the housing.

It is another object of the present invention to provide a chassis quick release device, wherein the rod body of the operating handle further comprises an outer convex annular piece formed at the cylindrical joint, and a stepped positioning block formed on the outer convex annular piece; the sleeve comprises a first positioning groove and a second positioning groove that are engaged with the stepped positioning block; the sleeve further comprises an interference bump provided between the first positioning groove and the second positioning groove, a wavy operating portion bent extending from the sleeve, a through groove provided on a top side of the wavy operating portion and communicating with the accommodating cavity; the operating handle further comprises a shaft with a head, the head of the shaft of the operating handle being accommodated in the through groove, the head of the shaft of the operating handle comprising an actuating groove recessed on a top side thereof for inserting a preset hand tool and a positioning rod extending from one side thereof and engaged in the shaft groove for fixation.

DETAILED DESCRIPTION OF THE PREFERRED EMBODIMENT

In order to achieve the abovementioned purpose and effect, the technical means and structure adopted by the present invention are hereby drawn to describe in detail the features and functions of the preferred embodiments of the present invention as follows, so as to facilitate a complete understanding.

Figure 1:
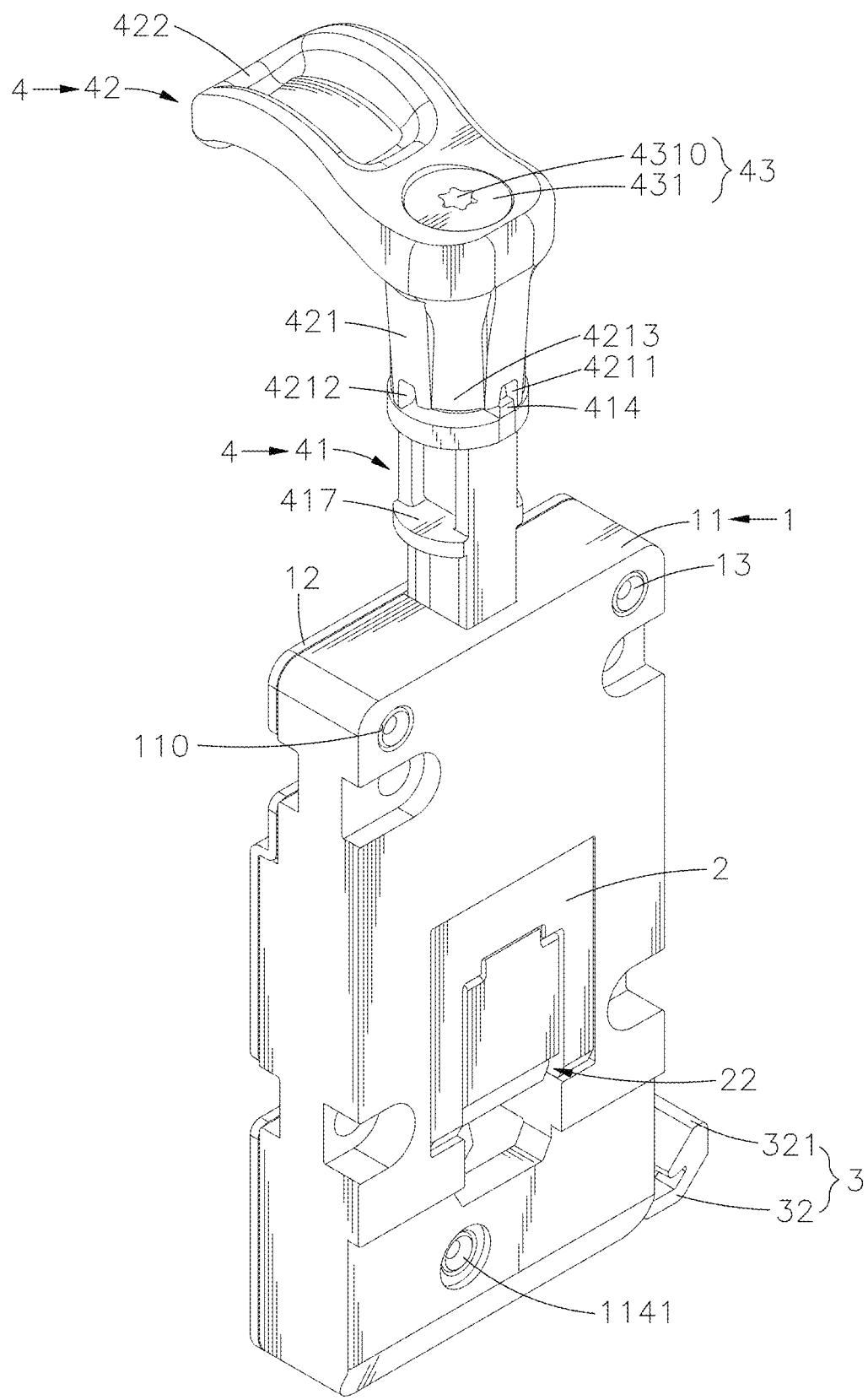
FIG. 1 is a perspective view of the present invention in an unlocked and shifted state.
Figure 2:
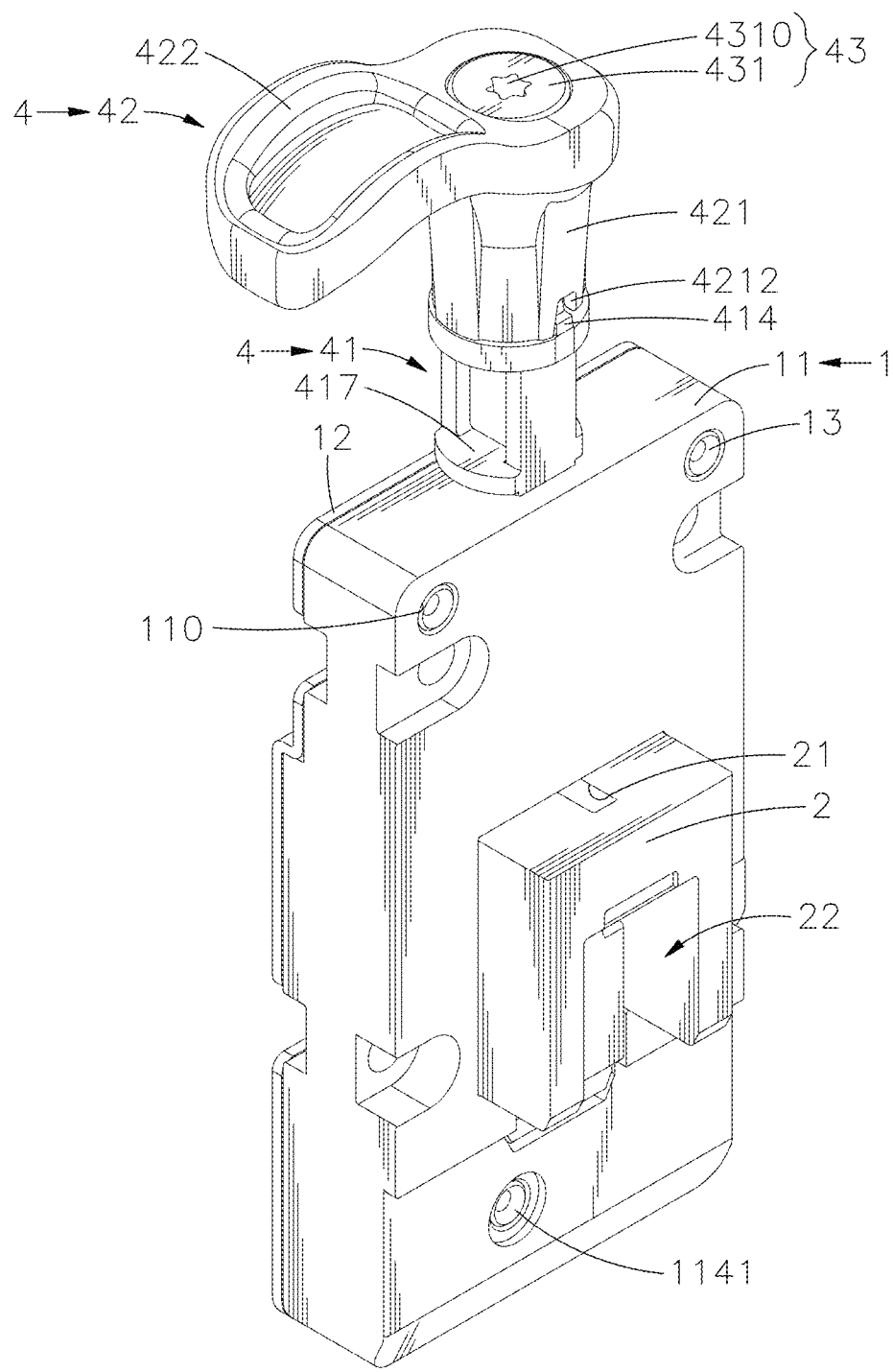
FIG. 2 is a perspective view of the present invention in a locked state.
Figure 3:
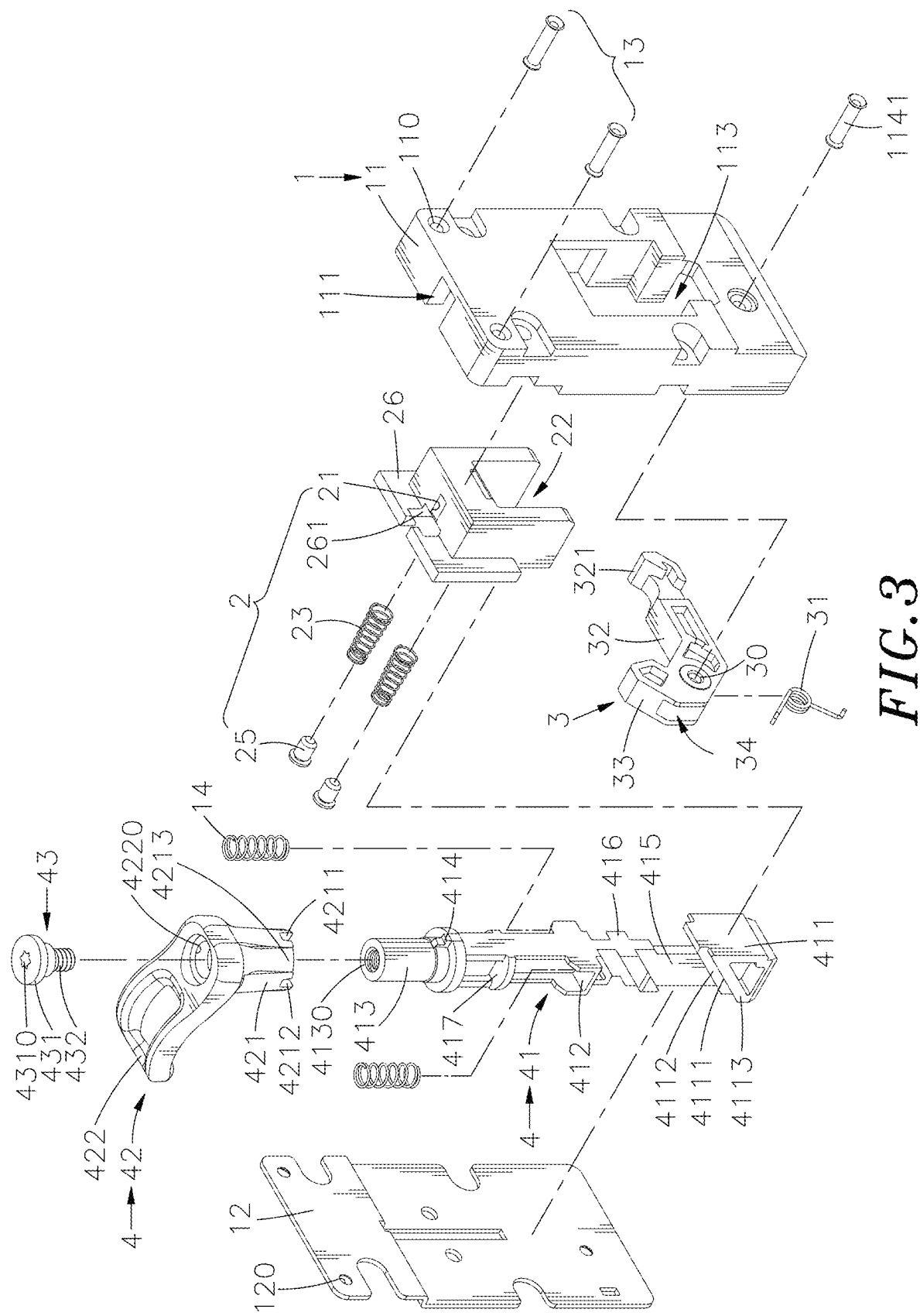
FIG. 3 is a three-dimensional exploded view of the present invention.
Figure 4:
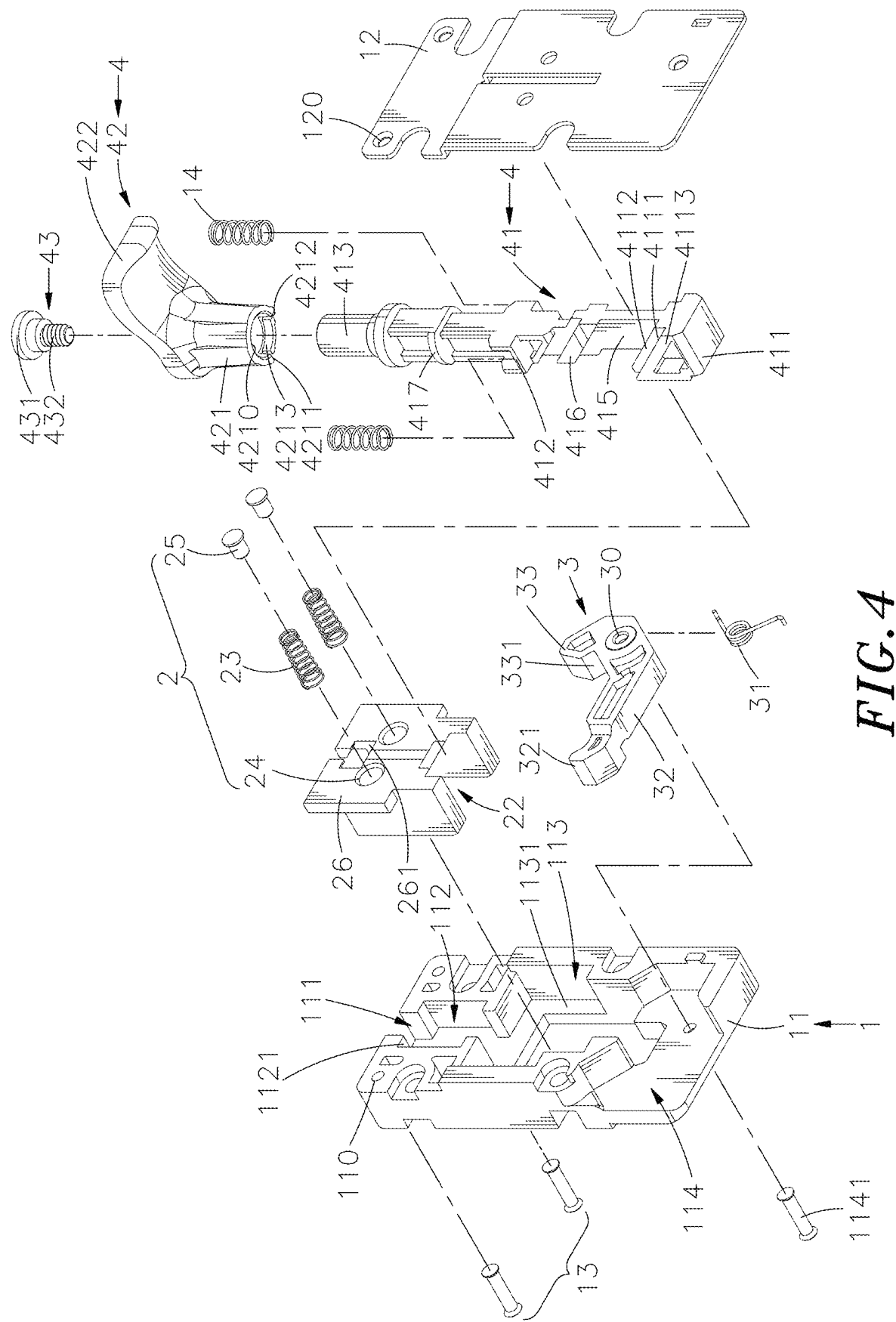
FIG. 4 is a three-dimensional exploded view of another perspective of the present invention.

Please refer to FIGS. 1 to 4, where FIG. 1 is a perspective view of the present invention in an unlocked and shifted state, FIG. 2 is a perspective view of the present invention in a locked state, FIG. 3 is a three-dimensional exploded view of the present invention, and FIG. 4 is a three-dimensional exploded view of another perspective of the present invention. It can be clearly seen from the drawings that the chassis quick release device of the present invention comprises: a housing 1, a locking block 2, a latch 3 and an operating handle 4, and its main components and features are described in detail as follows:

The housing 1 comprises a base 11 and a cover 12 that can be combined with each other. A sliding channel 111 and an accommodating space 113 are recessed in the base 11.

The locking block 2 is combined in the hollow accommodating space 113 and can move linearly.

The operating handle 4 comprises a rod body 41 positioned on the sliding channel 111. The rod body 41 is assembled with a grip 42. The rod body 41 of the operating handle 4 corresponding to the grip 42 is provided with a cylindrical joint 413 with a shaft groove 4130 inside. The grip 42 corresponding to the cylindrical joint 413 is provided with a sleeve 421 with an accommodating cavity 4210 inside. Through the foregoing structure, the grip 42 can generate rotational steering on the rod body 41 to facilitate pulling out of the preset chassis. According to the operating handle 4 moving toward the housing 1 direction, the locking block 2 makes a linear movement toward a first direction and slides out from the accommodating space 113 to form a locked state. In addition, according to the operating handle 4 being pulled in the direction away from the housing 1, the locking block 2 makes a linear movement in a second direction to form an unlocked state.

The base 11 is provided with a plurality of perforations 110 and the cover 12 is provided with a plurality of locking holes 120. The perforations 110 and the locking holes 120 are used for a plurality of fasteners 13 composed of a plurality of rivets to be penetrated and locked. The base 11 further comprises a compression space 112 in the sliding channel 111 and the accommodating space 113. The compression space 112 is further provided with a resistance wall 1121 for one end of at least linear reset member 14 to resist. The other end of the linear reset member 14 is held against a resisting plate 412 radially extending from the rod body 41 to provide a reset force for the operating handle 4 to move toward the housing 1. The linear reset member 14 refers to a spring.

There is a rotation space 114 on the bottom side of the base 11 adjacent to the accommodating space 113, and a shaft 1141 protrudes into the rotation space 114, and the shaft 1141 is composed of a rivet inserted between the base 11 and the cover 12. The rotation space 114 is further provided with the latch 3, which has an internal shaft hole 30 that is sleeved on the shaft 1141 and forms a positioning position. The latch 3 is provided with a rotary reset member 31 also positioned on the shaft 1141. One end of the latch 3 is formed with a resisting edge 321 that can rotatably protrude from the housing 1, and a locking edge 331 is formed at the other end of the latch 3 opposite to the resisting edge 321. The rotary reset member 31 refers to a torsion spring and is accommodated in a storage chamber 34 in the latch 3 to divide the shaft hole 30 into two portions. The center of the torsion spring provides a penetration for the shaft 1141. One end of the torsion spring resists the inner wall of the storage chambers 34 and the other end resists the inner wall of the rotation space 114. A large swing arm 32 with multiple turns is formed between the shaft hole 30 of the latch 3 and the resisting edge 321. A small swing arm 33 with multiple turns is formed between the shaft hole 30 and the locking edge 331, and the locking edge 331 is located inside the turns of the small swing arm 33.

Figure 5:
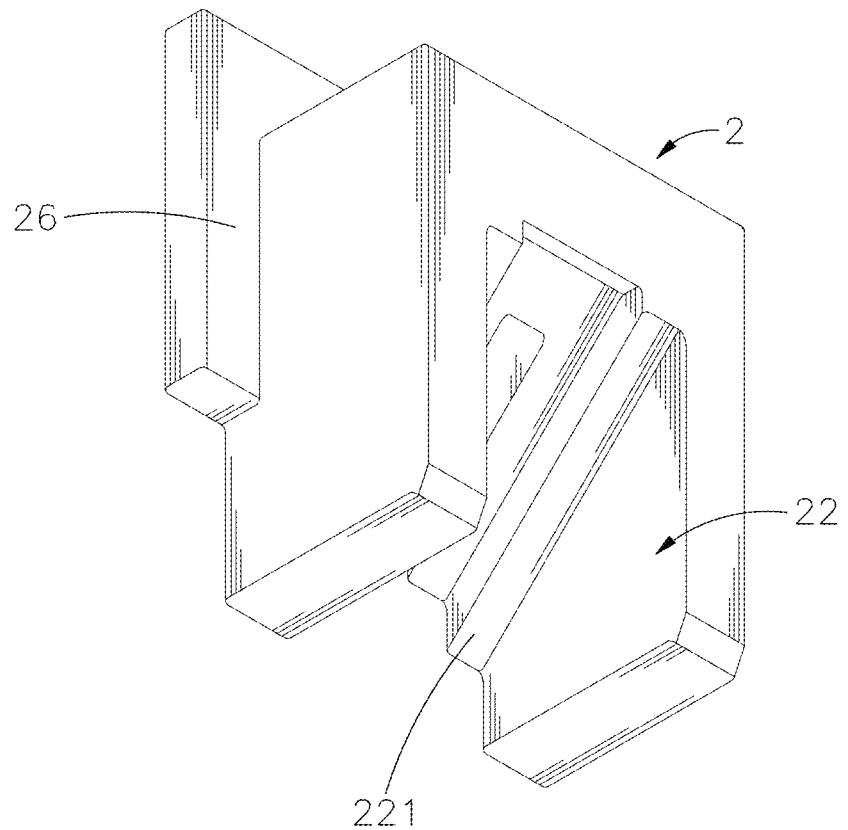
FIG. 5 is a three-dimensional structure diagram of the locking block of the present invention.
Figure 6:
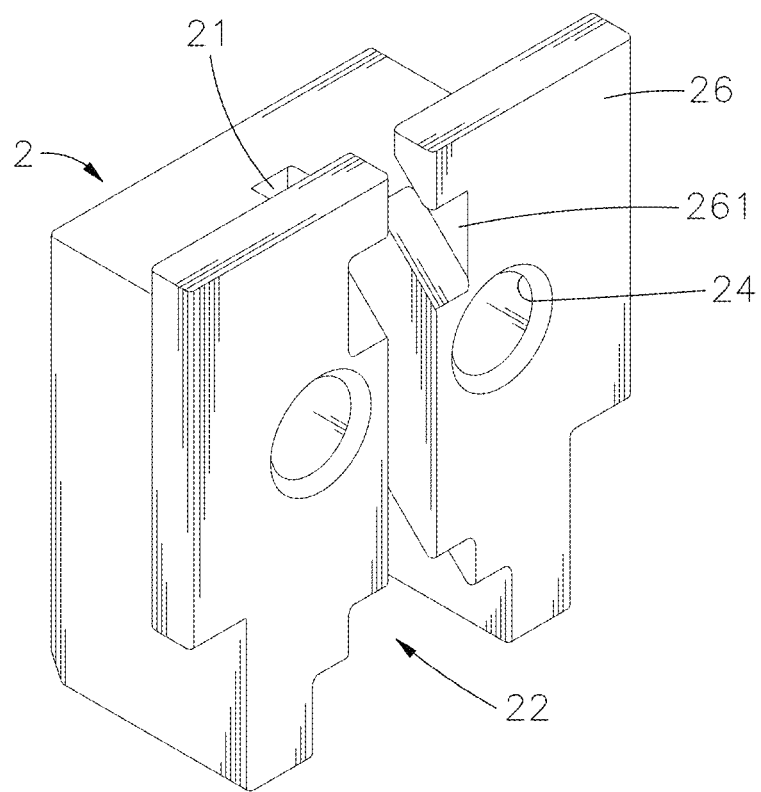
FIG. 6 is a three-dimensional structural view of the locking block of the present invention from another perspective.

Please also refer to FIGS. 5 and 6, in which the locking block 2 is provided with a guide groove 21 and a guide chamber 22 communicating with each other, and a receiving groove 24 for accommodating at least one elastic member 23 is provided in the locking block 2. The locking block 2 is formed with a stop plate 26 which is adjacent to the guide groove 21 and forms a linear sliding dead center. The accommodating space 113 of the base 11 is formed with a resistance groove 1131 corresponding to the sliding dead center of the stop plate 26. A chute 261 rising obliquely is formed above the stop plate 26. The opening of the receiving groove 24 of the locking block 2 for accommodating the elastic member 23 is further provided with a positioning piece 25 for one end of the elastic member 23 to be sleeved and placed. The side of the positioning piece 25 that is away from the elastic member 23 is against the inside of the cover 12; and the other end of the elastic member 23 is against the bottom wall of the receiving groove 24. The guide chamber 22 of the locking block 2 is a double triangular space with a larger interior and a smaller exterior. The guide chamber 22 further forms a "U"-shaped slope 221 at the bottom of the corresponding outer triangle (as shown in FIG. 5). The rod body 41 forms a locking portion 411 accommodated in the guide chamber 22. The locking portion 411 corresponds to form a "U"-shaped structure and the two side walls are a triangular structure, and the two triangular side walls each form a resisting edge 4111 where they contact the slope 221. A resisting bump 4112 is formed between the two resisting edges 4111 and is in contact with the inner triangular bottom of the guide chamber 22, and one of the two side walls that is close to the locking edge 331 of the latch 3 forms a locking area 4113.

The above-mentioned operating handle 4 comprises the said rod body 41 positioned on the sliding channel 111, the guide groove 21 and the guide chamber 22. The rod body 41 abuts against the guide chamber 22 to form the said corresponding locking portion 411, and there is a guide 416 extending upward obliquely between the locking portion 411 and the resisting plate 412 and passing through the chute 261 of the locking block 2. The rod body 41 is assembled with the grip 42 away from the locking portion 411, and has stop pieces 417 expanding to both sides between the cylindrical joint 413 and the resisting plate 412. The stop pieces 417 form the bottom dead center which the operating handle 4 moves towards the housing 1. An outer convex annular piece is formed at the cylindrical joint 413, and a stepped positioning block 414 is formed on the annular piece. The sleeve 421 has a first positioning groove 4211 and a second positioning groove 4212 that are engaged with the stepped positioning block 414. An interference bump 4213 is provided between the first positioning groove 4211 and the second positioning groove 4212. A wavy operating portion 422 extends from the sleeve 421. A through groove 4220 is provided on the top side of the wavy operating portion 422 for receiving the head 431 of a shaft 43 and communicating with the accommodating cavity 4210. The top side of the head 431 is recessed with an actuating groove 4310 for inserting a preset hand tool (not shown in the figure) to adjust locking or unlocking. The positioning rod 432 extending from one side of the head 431 of the shaft 43 extends into and engages in the shaft groove 4130 for fixation. A rail plate 415 is formed between the cylindrical joint 413 and the locking portion 411 of the rod body 41, which extends into the sliding channel 111, the guide groove 21, and the guide chamber 22 and forms positioning and movement.

When assembling the chassis quick release device of the present invention, first set the latch 3 that has assembled with the rotary reset member 31 at the shaft 1141 of the base 11 to form a position, then continue to penetrate set the locking block 2 installed in the elastic member 23 to the resistance grooves 1131 located in the accommodating space 113, and then align the rod body 41 of the operating handle 4 with the sliding channel 111, the guide groove 21, and the guide chamber 22 for assembly. At the same time, the guide 416 is inserted into the chute 261, the grip 42 of the operating handle 4 is exposed on the base 11, and the stop pieces 417 are resisted above the housing 1. Finally, after the plurality of locking holes 120 of the cover 12 are paired with the plurality of perforations 110 of the base 11, the plurality of fasteners 13 composed of a plurality of rivets are penetrated and riveted for fixation. Through the above, the assembly of the chassis quick release devices is completed.

Figure 7:
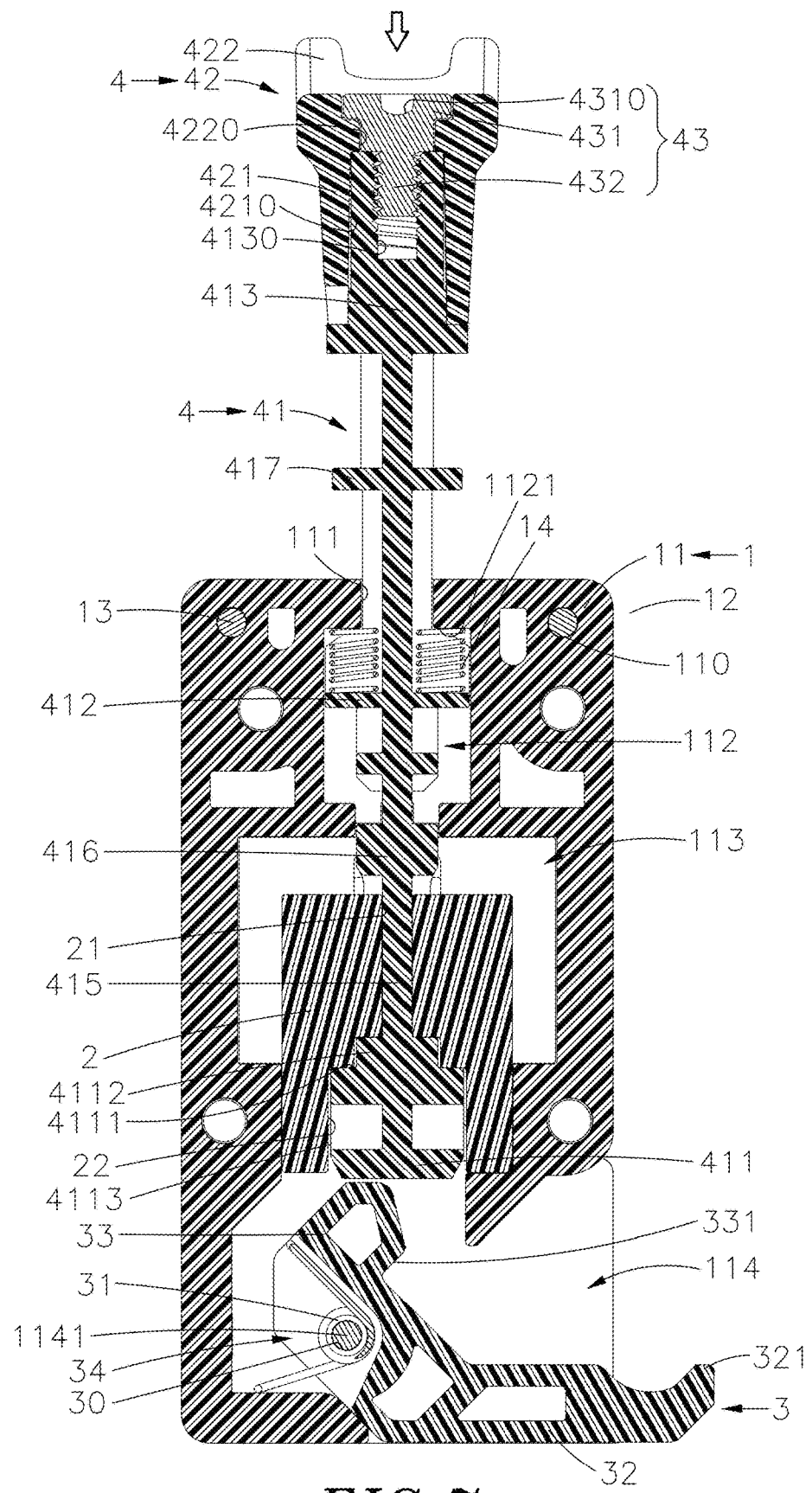
FIG. 7 is a side sectional view of the present invention in an unlocked and shifted state.
Figure 8:
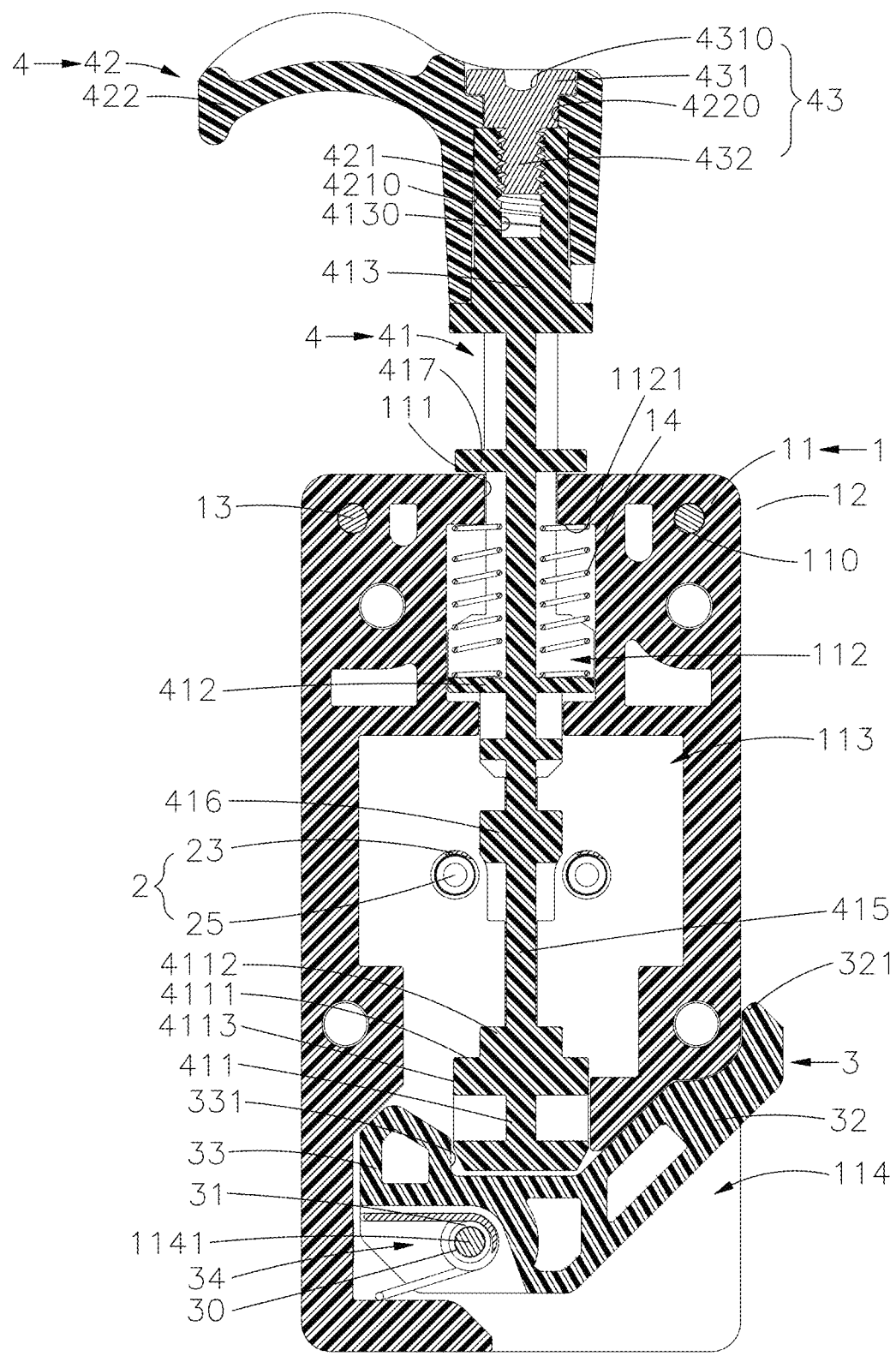
FIG. 8 is a side sectional view of the present invention in a locked state.
Figure 9:
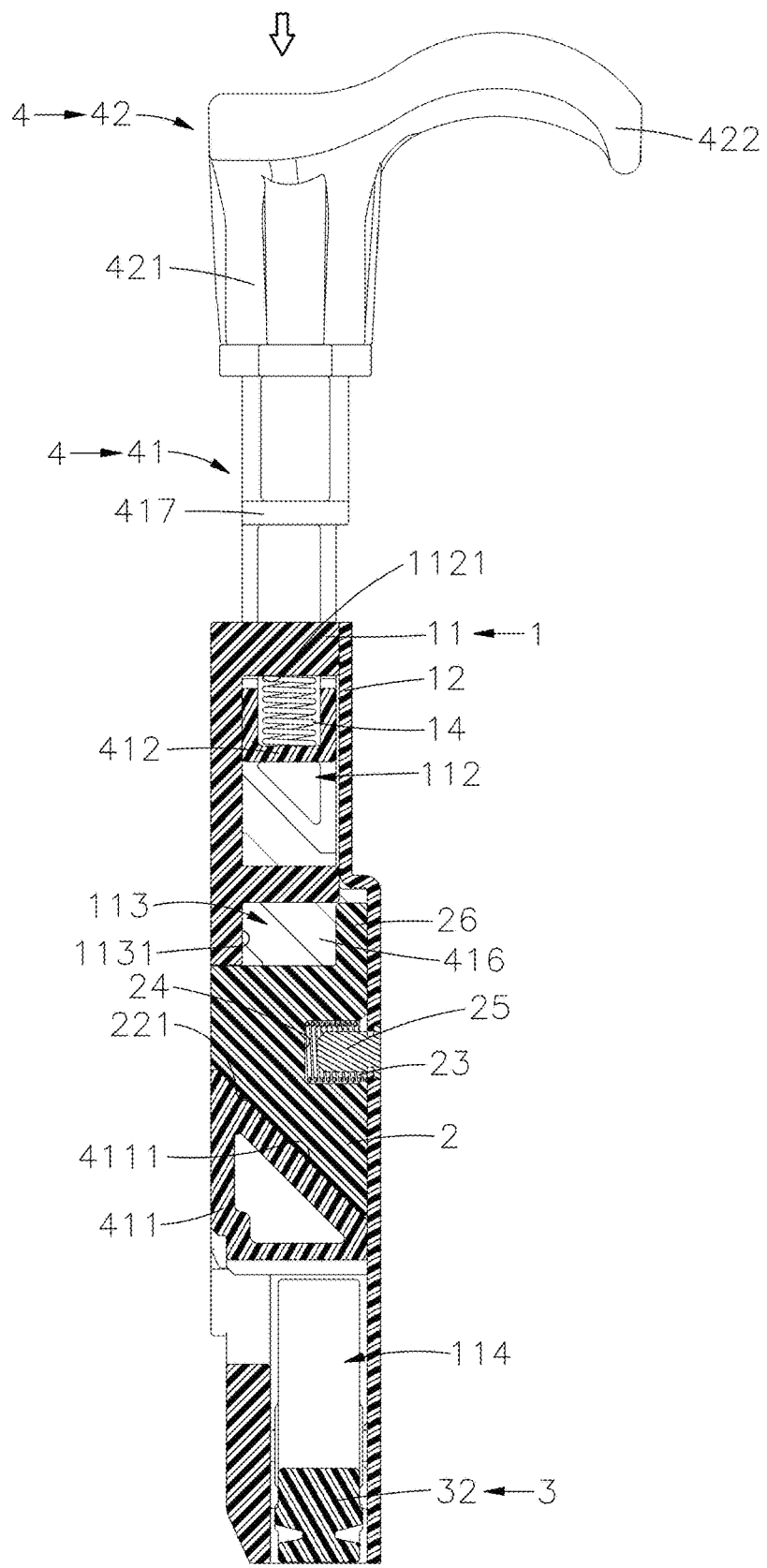
FIG. 9 is another side sectional view of the present invention in an unlocked and shifted state.
Figure 10:
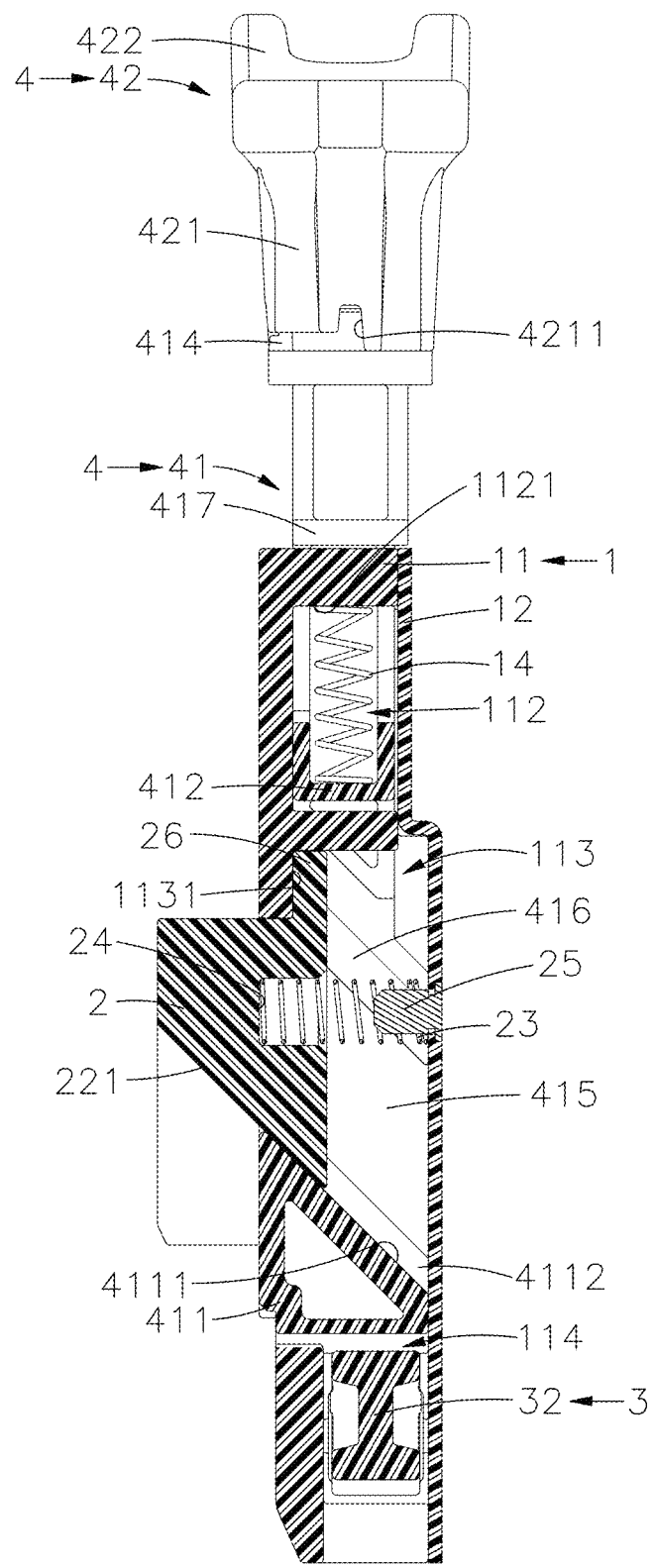
FIG. 10 is another side sectional view of the present invention in a locked state.
Figure 11:
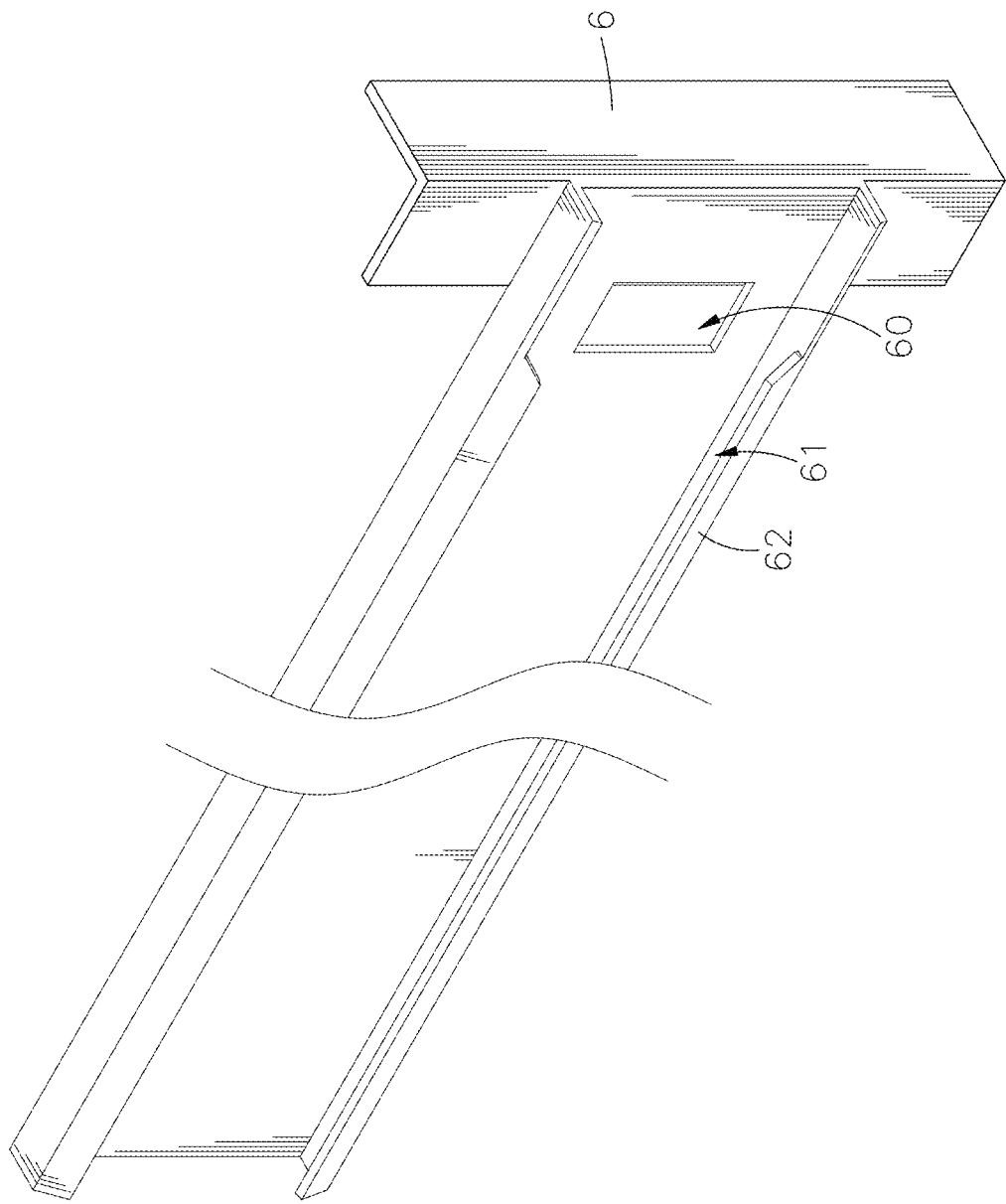
FIG. 11 is a three-dimensional schematic view of the cabinet of the present invention.
Figure 12:
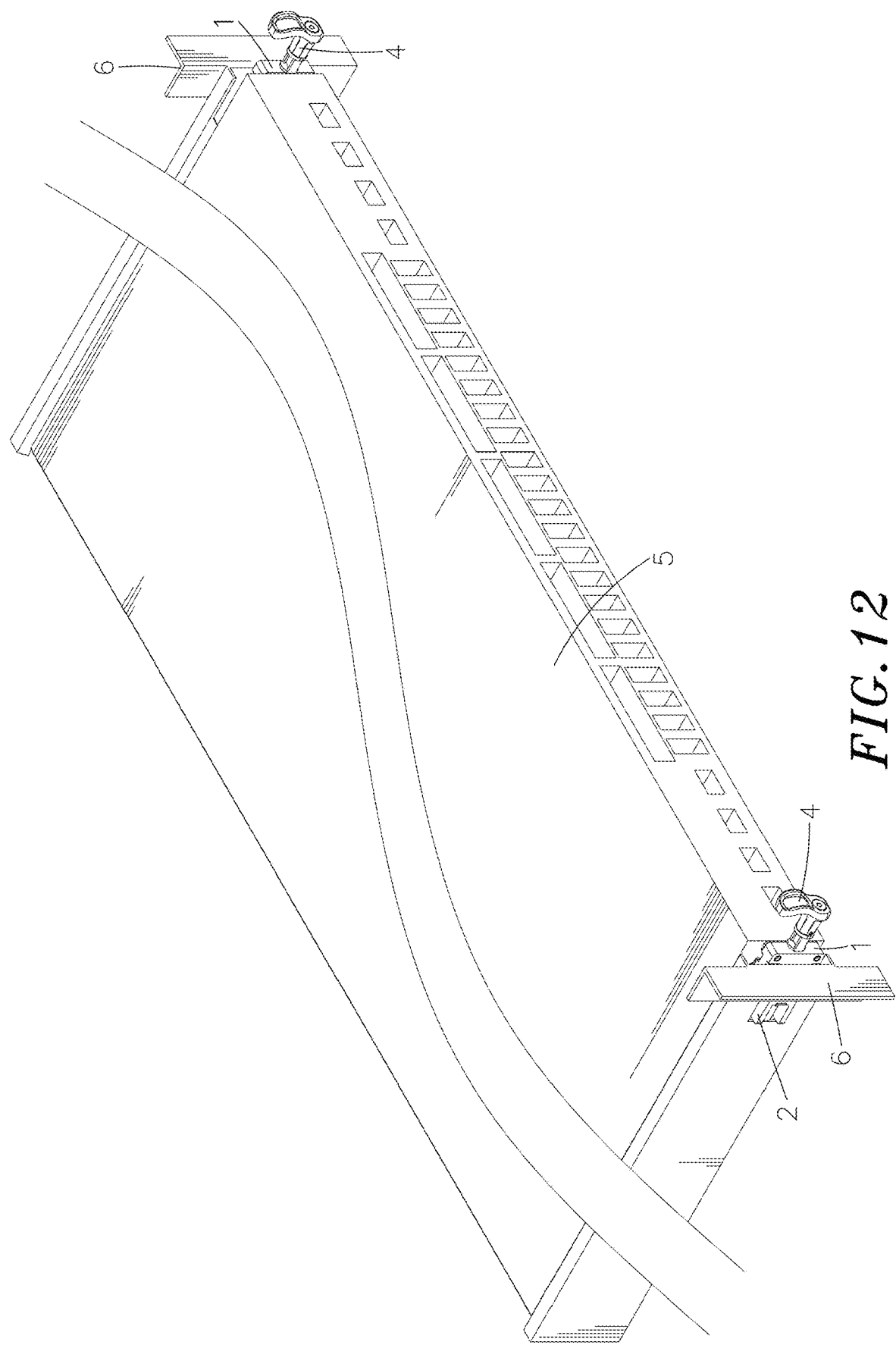
FIG. 12 is an applied view of the present invention.
Figure 13:
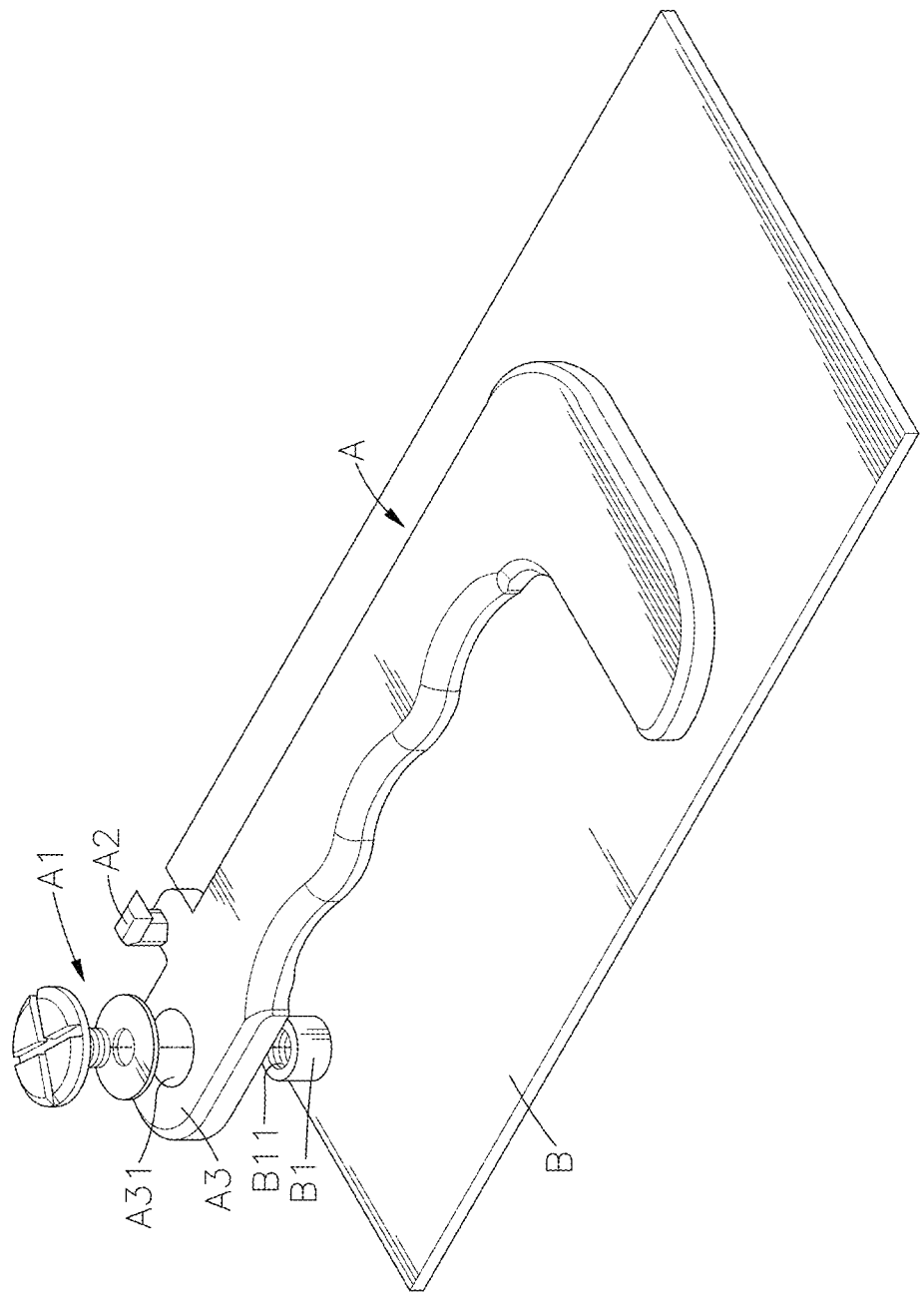
FIG. 13 is the structural diagram of the buckle structure of the conventional cabinet before assembly.
Figure 14:
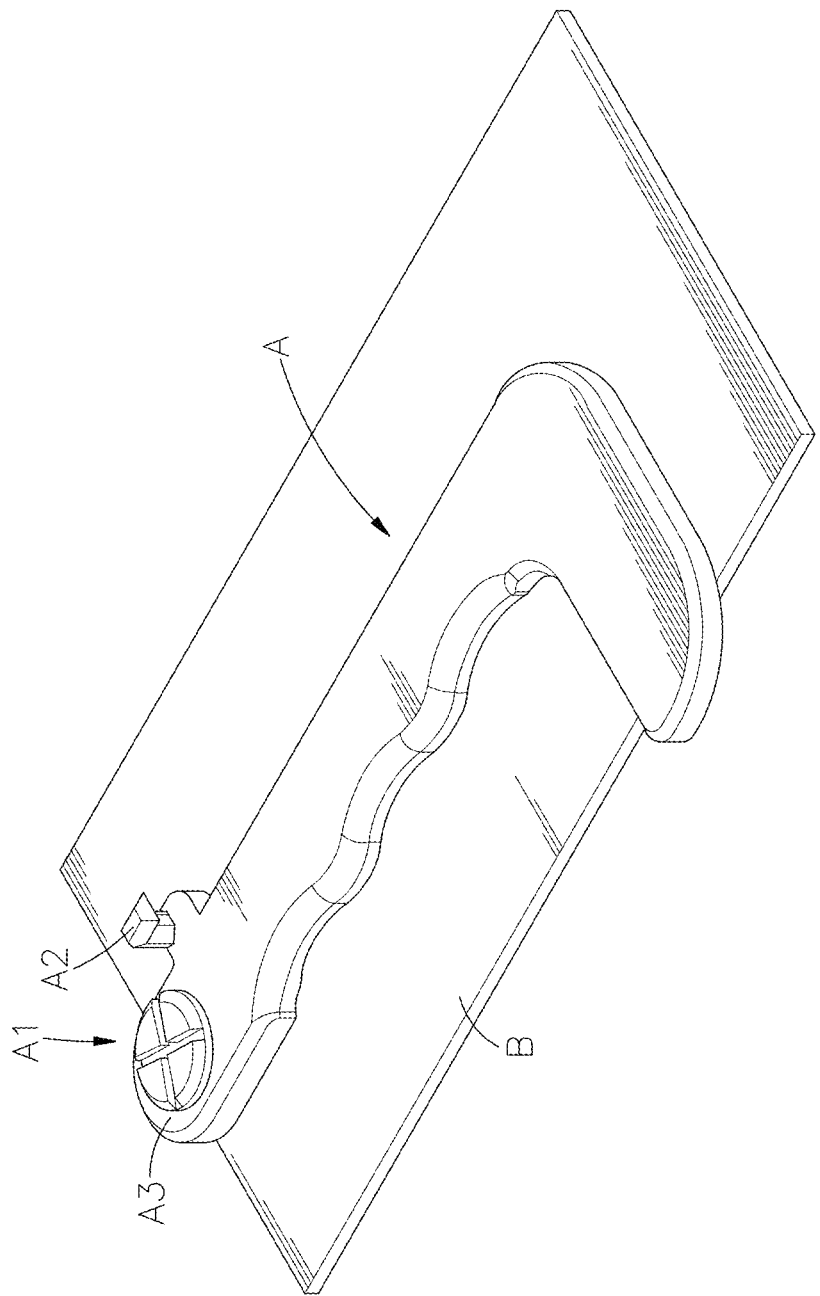
FIG. 14 is the structural diagram of the buckle structure of the conventional cabinet after assembly.

Please refer to FIGS. 7-12, where FIG. 7 is a side sectional view of the present invention in an unlocked and shifted state, FIG. 8 is a side sectional view of the present invention in a locked state, FIG. 9 is another side sectional view of the present invention in an unlocked and shifted stat, FIG. 10 is another side sectional view of the present invention in a locked state, FIG. 11 is a three-dimensional schematic view of the cabinet of the present invention, and FIG. 12 is an applied view of the present invention, and also refer to FIGS. 1 and 2. When the chassis quick release device of the present invention is implemented, two sets of chassis quick release devices need to be locked into the screw grooves on the front ends of left and right sides of the preset chassis 5 by using a plurality of screws exposed on the cover 12, then adjust the operating handle 4 to pull the rod body 41 away from the housing 1 and partially expose the rod body 41 to the housing 1, then the locking portion 411 can be pushed into the guide chamber 22. Through the force of the abutting edge 4111 of the locking portion 411 against the slope 221 of the guide chamber 22, and at the same time, the locking block 2 forms an inclined downward linear sliding through the guide 416 in the chute 261 to form a double-guided linear sliding structure of the locking block 2, the locking block 2 can be pressed down and the elastic member 23 can be compressed to form an unlocked state (as shown in FIGS. 1, 7, and 9). At the same time, after the locking portion 411 is moved from the rotating space 114 back to the guide chamber 22 of the locking block 2, the locking edge 331 of the latch 3 lacks the resistance of the locking area 4113 of the locking portion 411, and the rebound force of the rotary reset member 31 makes the large swing arm 32 partly rotate out of the housing 1. Next, push the rear end (where the chassis quick release devices are not assembled) of the preset chassis 5 with the assembled and unlocked chassis quick release devices into the cabinet 6 as disclosed in FIG. 1, and the large swing arm 32 of the latch 3 protruding from the bottom side of each chassis quick release device is retracted into the rotating space 114 by the pushing force resisted by the push groove 61, and only the inner wall surface of the resisting edge 321 at the end of the large swing arm 32 is attached to the base 11. The outer wall protruding from the resisting edge 321 of the housing 1 forms a guide rail and sticks to the surface of the push groove 61. By using the limiting plate 62 extending obliquely from the push groove 61 to make a resisting limit, the resisting edge 321 in the process of moving will not be derailed. The side length of the preset chassis 5 is slightly shorter than the length of the push groove 61. Therefore, when the rear end of the preset chassis 5 is moved to the end of the push groove 61, the locking block 2 of the chassis quick release device can just align with the locking hole 60 located on the vertical wall of the cabinet 6. Then the operating handle 4 can be pushed toward the housing 1, so that the locking portion 411 is partially pushed out of the guide chamber 22 and enters the rotating space 114, the locking block 2 is thrust by the elastic member 23 and linearly slides upward along the guide 416 of the operating handle 4 to slide out from the accommodating space 113 and snap into the locking hole 60 of the cabinet 6 to form a locked state. At the same time, after the locking portion 411 is moved from the guide chamber 22 of the locking block 2 to the rotating space 114, the locking area 4113 of the locking portion 411 extends into the inner side of the small swing arm 33 of the latch 3 and is held against the locking edge 331, so that the latch 3 presents a locked state that does not swing (as shown in FIGS. 2, 8, and 10). Through the above operations, the preset chassis 5 can be quickly fixed in the cabinet 6.

Based on the above, when you want to pull out the preset chassis 5 from the cabinet 6, you only need to adjust the operating handle 4 to pull the rod body 41 away from the housing 1 and partially expose the rod body 41 to the housing 1, so that the locking block 2 retracts from the locking hole 60 of the cabinet 6 into the accommodating space 113 to form an unlocked state. At the same time, the large swing arm 32 of the latch 3 partially rotates and protrudes from the housing 1 and the resisting edge 321 is resisted on the surface of the push groove 61, so that the front end of the preset chassis 5 is supported by the latch 3 to make a small lift, and the preset chassis 5 in a tilted state is easier to pull out from the cabinet 6 with force. In order to operate smoothly in the narrow cabinet 6 space, it is necessary to turn the wavy operating portion 422 (for example: turn the wavy operating portion 422 of the operating handle 4 on the left side of the preset chassis 5 from the direction of twelve o'clock to the direction of three o'clock; turn the wavy operating portion 422 of the operating handle 4 on the right side of the preset chassis 5 from the direction of twelve o'clock to the direction of nine o'clock). The specific operation method of turning the operating portion 422 is as follows: Apply force to the wavy operating portion 422 in the direction of twelve o'clock to make it rotate. The positioning block 414 before applying force is engaged with the first positioning groove 4211. In the process of rotating the wavy operating portion 422 to the second positioning groove 4212 located at three o'clock or nine o'clock, the upper outer wall of the stepped positioning block 414 makes a frictional resistance against the inner wall of the two interference protrusions 4213 in sequence to form a segmented feel. Finally, the positioning block 414 is snapped to the second positioning groove 4212 to achieve the purpose of turning the wavy operating portion 422 and making it easy to drag out the preset chassis 5. After the preset chassis 5 is pulled out from the cabinet 6, adjust the wavy operating portion 422 of the operating handles 4 on both sides of the preset chassis 5 back to the twelve o'clock position and make a snap positioning (that is, through the rotation of the wavy operating portion 422, the stepped positioning block 414 is moved out of the second positioning groove 4212 and engaged in the first positioning groove 4211). Through the above operations, the purpose of quickly disassembling the chassis 5 from the cabinet 6 can be achieved.

From the above-mentioned disclosure of FIGS. 1 to 12, it can be understood that the main feature of the present invention is to propose chassis quick release devices combined on both sides of the preset chassis 5. The operating handle 4 of the chassis quick release device can be moved toward the housing 1, so that the locking block 2 can be stretched out and locked in the locking hole 60 of the cabinet 6, so that the preset chassis 5 can be fixed quickly with the cabinet 6. In addition, when the operating handle 4 is pulled in a direction away from the housing 1, the locking block 2 is retracted from the locking hole 60 of the cabinet 6 into the accommodating space 113 to form an unlocked state, so as to quickly disassemble the preset chassis 5 from the cabinet 6. The invention is applied in the field of installation, disassembly, and maintenance of computer components in the server room, and has excellent practicability, so a patent application is filed to seek the protection of the patent right.

The above description is only a preferred embodiment of the present invention, and it does not limit the scope of the patent of the present invention. Therefore, any simple modifications and equivalent structural changes made by using the contents of the description and drawings of the present invention should be similarly included in the scope of the patent of the present invention.

To sum up, the above-mentioned chassis quick release device of the present invention can indeed achieve its effect and purpose when it is used, so the present invention is an invention with excellent practicability. In order to meet the application requirements for an invention patent, an application should be filed in accordance with the law. It is hoped that the review committee will approve the case as soon as possible to protect the hard work of the inventor. If the review committee has any doubts, please do not hesitate to send a letter for instructions, the inventor will do his best to cooperate.

What the invention claimed is:

1. A chassis quick release device, comprising:
a housing comprising a base and a cover that are capable of being combined with each other, said base comprising a sliding channel and an accommodating space connected to each other;
a locking block combined in said accommodating space and movable linearly; and
an operating handle, said operating handle comprising a rod body positioned on said sliding channel, said rod body being assembled with a grip, said rod body comprising a cylindrical joint corresponding to said grip, said cylindrical joint defining therein a shaft groove, said grip being provided with a sleeve corresponding to said cylindrical joint, said sleeve defining therein an accommodating cavity;
wherein through the structure of the chassis quick release device, said grip is capable of producing rotational steering on said rod body to facilitate pulling out of a preset chassis; when moving said operating handle in a direction of said housing, said locking block makes a linear movement in a first direction and slides out from said accommodating space to form a locked state; when pulling said operating handle away from said housing, said locking block makes a linear movement in a second direction to form an unlocked state, and
wherein said base further comprises a compression space in said sliding channel and said accommodating space, said compression space being further provided with a resistance wall for one end of at least one linear reset member to resist, each said linear reset member having an opposite end thereof held against a resisting plate radially extending from said rod body to provide a reset force for said operating handle to move toward said housing, each said linear reset member is a spring.

2. The chassis quick release device as claimed in claim 1, wherein said base comprises a plurality of perforations and said cover comprises a plurality of locking holes, said perforations and said locking holes being for penetration and locking of multiple fasteners composed of multiple rivets.

3. The chassis quick release device as claimed in claim 1, wherein said locking block is provided with a guide groove and a guide chamber communicated with each other, and said locking block further comprises a receiving groove, at least one elastic member accommodated in said receiving groove, a stop plate located adjacent to said guide groove to form a linear sliding dead center and a chute rising obliquely on a top side of said stop plate; said base further comprises a resistance groove formed in said accommodating space corresponding to said sliding dead center of said stop plate.

4. The chassis quick release device as claimed in claim 3, wherein said locking block is provided with at least one positioning piece in an opening of said receiving groove for one end of each said elastic member to be placed on one respective said positioning piece, each said positioning piece having one side thereof disposed away from said at least one elastic member and held against an inner side of said cover, each said elastic member having one end thereof sleeved onto one respective said positioning piece and an opposite end thereof stopped against a bottom wall of said receiving groove.

5. The chassis quick release device as claimed in claim 3, wherein said guide chamber of said locking block is a double triangular space with a larger interior and a smaller exterior; said guide chamber further forms a "U"-shaped slope at a bottom of a corresponding outer triangle thereof; said rod body forms a locking portion accommodated in said guide chamber, said locking portion corresponding to a "U"-shaped structure and having two side walls thereof forming a triangular structure, and the two side walls of said triangular structure each forming a resisting edge in contact with said slope, said locking portion being provided with a resisting bump located between said two resisting edges and disposed in contact with an inner triangular bottom of said guide chamber, and one of the two side walls of said locking portion forming a locking area.

6. The chassis quick release device as claimed in claim 1, wherein said base further comprises a rotation space located on a bottom side thereof adjacent to said accommodating space, and a shaft protruding in said rotation space, said shaft being composed of a rivet inserted between said base and said cover, said rotation space being provided with a latch, said latch comprising an internal shaft hole sleeved on said shaft and positioned, said latch being provided with a rotary reset member inside and positioned on said shaft, said latch having one end thereof formed with a resisting edge that is capable of rotatably protruding from said housing, and an opposite end thereof formed with a locking edge opposite to said resisting edge, said rotary reset member referring to a torsion spring and being accommodated in one of the storage chamber in said latch which divide said shaft hole into two portions, said torsion spring having a center thereof provided for said shaft to penetrate, one end thereof stopped against an inner wall of said storage chamber and an opposite end thereof stopped against an inner wall of said rotation space.

7. The chassis quick release device as claimed in claim 6, wherein said latch further comprises a large swing arm with multiple turns formed between said shaft hole and said resisting edge and a small swing arm with multiple turns formed between said shaft hole and said locking edge; said locking edge is located inside one of the turns of said small swing arm of said latch.

8. The chassis quick release device as claimed in claim 3, wherein said rod body of said operating handle is positioned on said sliding channel, said guide groove and said guide chamber, said rod body resisting said guide chamber to form a locking portion, said rod body comprising a guide extending upward obliquely between said locking portion and said resisting plate and passing through said chute of said locking block, said rod body being assembled with said grip far away from the locking portion and having two stop pieces expanding to both sides between said cylindrical joint and said resisting plate, said stop pieces forming a dead center under which said operating handle moves towards said housing, said rod body further comprising a rail plate formed between said cylindrical joint and said locking portion and extending into said sliding channel, said guide groove and said guide chamber to form positioning and movement.

9. The chassis quick release device as claimed in claim 1, wherein said rod body of said operating handle further comprises an outer convex annular piece formed at said cylindrical joint, and a stepped positioning block formed on said outer convex annular piece; said sleeve comprises a first positioning groove and a second positioning groove that are engaged with said stepped positioning block; said grip further comprises an interference bump provided between said first positioning groove and said second positioning groove, a wavy operating portion bent extending from said sleeve, a through groove provided said through groove on a top side of said wavy operating portion for accommodating a head of a shaft and communicating with said accommodating cavity; the head of the shaft of said operating handle comprising an actuating groove recessed on a top side thereof for inserting a preset hand tool and a positioning rod extending from one side thereof and engaged in said shaft groove for fixation.

\* \* \* \* \*